United States Patent [19]

Tavis

[11] Patent Number: 4,947,139
[45] Date of Patent: Aug. 7, 1990

[54] VERY LOW INPUT POWER OSCILLATOR WITH IMPROVED AMPLITUDE STABILITY

[75] Inventor: John R. Tavis, Mariposa, Calif.
[73] Assignee: Tavis Corporation, Mariposa, Calif.
[21] Appl. No.: 365,416
[22] Filed: Jun. 13, 1989
[51] Int. Cl.$^5$ .......................... H03B 5/12; H03L 5/00
[52] U.S. Cl. .................................... 331/109; 331/114; 331/117 R
[58] Field of Search .................. 331/109, 114, 117 R, 331/117 FE, 182, 183

[56] References Cited

U.S. PATENT DOCUMENTS 3,763,444 10/1973 Tavis ..................................... 331/109
3,837,227 9/1974 Tavis ..................................... 73/753

Primary Examiner—David Mis
Attorney, Agent, or Firm—Christie, Parker & Hale

[57] ABSTRACT

An improved control circuit for maintaining constant amplitude of the sinusoidal output signal of an oscillator circuit by synchronously demodulating the signal using a push-pull transistor pair operating in saturation to generate a control signal for comparison with a reference voltage in a direct coupled negative feedback loop to the oscillator. The configuration of the feedback loop provides effectively instantaneous control response to eliminate low frequency modulation propagated internally in the oscillator due to noise generation in circuit components.

5 Claims, 3 Drawing Sheets

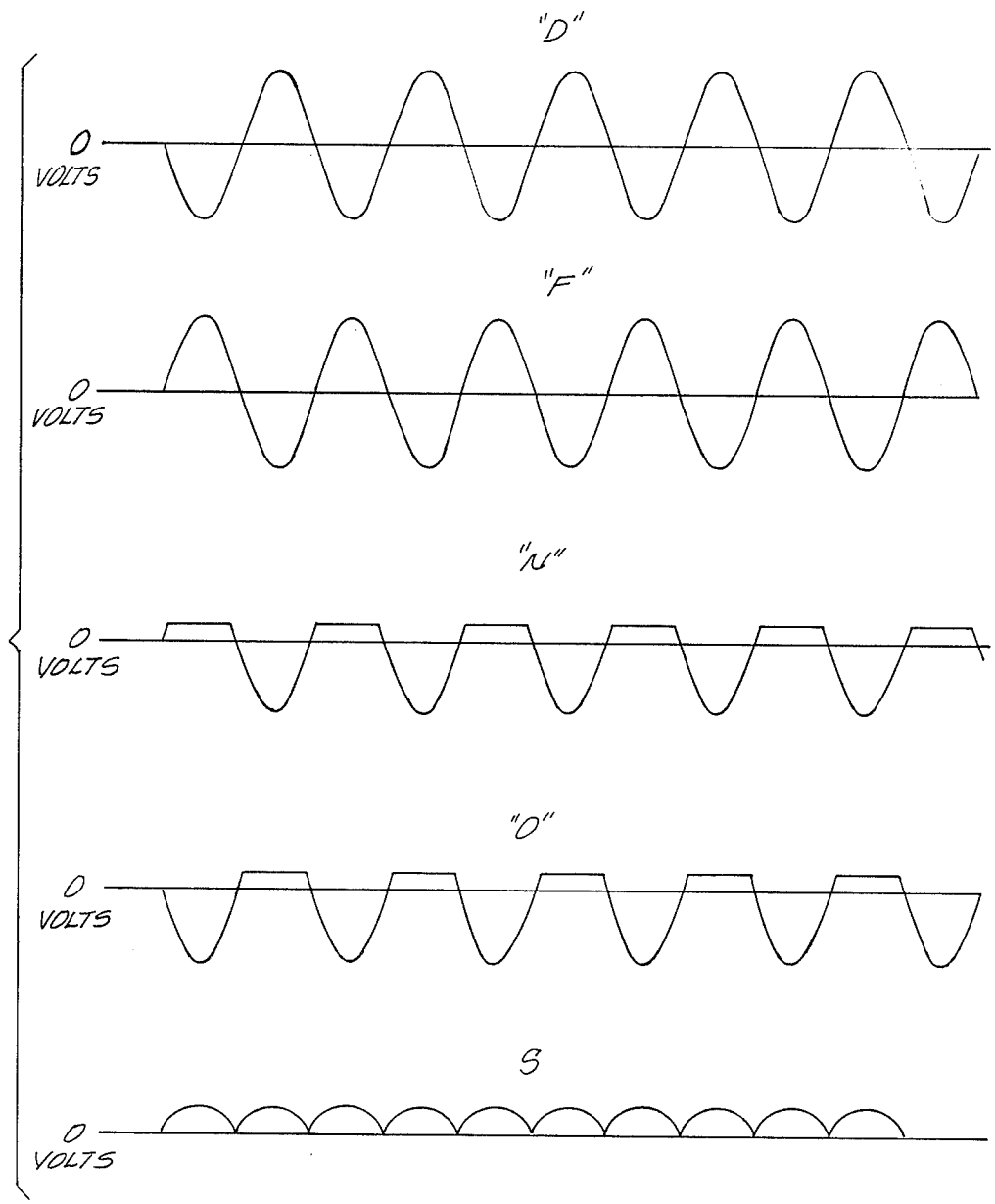

VERY LOW INPUT POWER OSCILLATOR WITH IMPROVED AMPLITUDE STABILITY

BACKGROUND OF THE INVENTION

1. Field of the Invention

This invention relates generally to sinusoidal oscillators, and, more particularly, the invention disclosed relates to an improved control circuit for maintaining constant amplitude of the sinusoidal output signal of an oscillator circuit with minimum input power requirements.

2. Description of the Prior Art

Variable reluctance pressure transducers and other electrical circuits often require highly stable oscillators with constant amplitude output signals. In the transducer field it has been found that excitation by a sinusoidal input signal provides an advantage in reducing radio frequency interference and ease of amplification due to lower frequency band pass requirements.

Prior art oscillators have achieved amplitude stabilization through various methods. A first method involved the use of a variable impedance connected in the positive feedback path to attenuate the amplitude of the AC signal being fed back. Control of the variable impedance was achieved through a DC control voltage derived from the AC output signal. This control technique was highly sensitive to changes in input voltages or temperature variation and efficiency of variable impedance controlled oscillators was low.

Alternate control techniques made use of an AC to DC convertor for deriving a DC signal from the AC output signal. The DC signal was then provided through a negative feedback path including a differential amplifier to control the DC current supplied to the input of the oscillator. The differential amplifier compares the DC converted signal to a DC reference signal for control of the sine wave amplitude. This prior art technique as exemplified in U.S. Pat. No. 3,763,444 to Tavis proved highly insensitive to temperature variations and input voltage changes due to the use of the differential amplifier in the negative feedback path of the oscillator.

SUMMARY OF THE INVENTION

The present invention provides improved amplitude stability for a sinusoidal oscillator by improving low frequency noise rejection in the control circuit. The present invention retains the temperature insensitivity of the prior art control systems using a differential amplifier in the negative feedback loop and operates with a very low power requirement.

The- present invention comprises an oscillator including a transformer having a primary winding with a power feed to the center tap. A first pair of transistors in a push-pull configuration are connected across the primary winding at the emitter electrodes. The base electrodes of the transistors are commonly connected to receive a control current. The collector electrodes of the transistors are connected across a secondary winding of the transformer. A center tap on the secondary winding is provided for negative polarity power return. A capacitive element is connected across the secondary winding to create a tuned circuit within the oscillator.

The control current input for the first pair of transistors in the oscillator is derived through phase sensitive synchronous demodulation of the AC signal present across the secondary winding of the transformer. A second pair of transistors connected as common emitters having base connections to opposite ends of the secondary winding provide rectification of the signal. Collector connections on the second pair of transistors are made through voltage dividers to the ends of the secondary winding opposite the base connections and to a common output point. A rectified control signal is thereby provided at the common output.

The control signal is fed to a first input of an operational amplifier. A DC reference voltage is provided to a second input of the operational amplifier which acts as a differential amplifier comparing the control signal with the DC voltage and providing a corresponding voltage output. The voltage output of the operational amplifier is connected to the base of a fifth transistor for conversion to a control current. The emitter of the fifth transistor is connected to a current source and the collector is connected to the common base electrodes of the first pair of transistors in the oscillator to control the output voltage of the oscillator.

The characteristics of the second transistor pair in the demodulator provide for significant noise rejection. One transistor or the other is fully coupled to the rectified output at all times. In addition, the transistors operate in a saturated condition, thereby having very low resistance, and the transistors conduct in both directions. Therefore, no instantaneous rectified noise signal can seriously modify the average detected signal in the transistors. Prior art devices using half-wave peak detectors or similar control systems were subject to random modulation by flicker and pop corn noise. A noise pulse rectified by the control system affected the control signal provided to the differential amplifier which in turn altered the control signal for the sinusoidal amplitude of the oscillator. The net result was internally generated low frequency noise below 1 Hz. The present invention provides a factor of improvement of approximately 100 over the prior art device in noise reduction. Use of the present invention to provide a constant amplitude sinusoidal signal for a variable reluctance pressure transducer provides the ability to monitor pressure changes which are as little as $1 \times 10^{-6}$ of full scale due to the significantly reduced noise in the control circuit of the oscillator.

Input power levels required by the circuit of the present invention are as low as 90 uW resulting in a high stability low power oscillator.

BRIEF DESCRIPTION OF THE DRAWINGS

The features of the present invention will be more fully described with reference to the drawings in which.

DESCRIPTION OF THE PREFERRED EMBODIMENT

Figure 1:
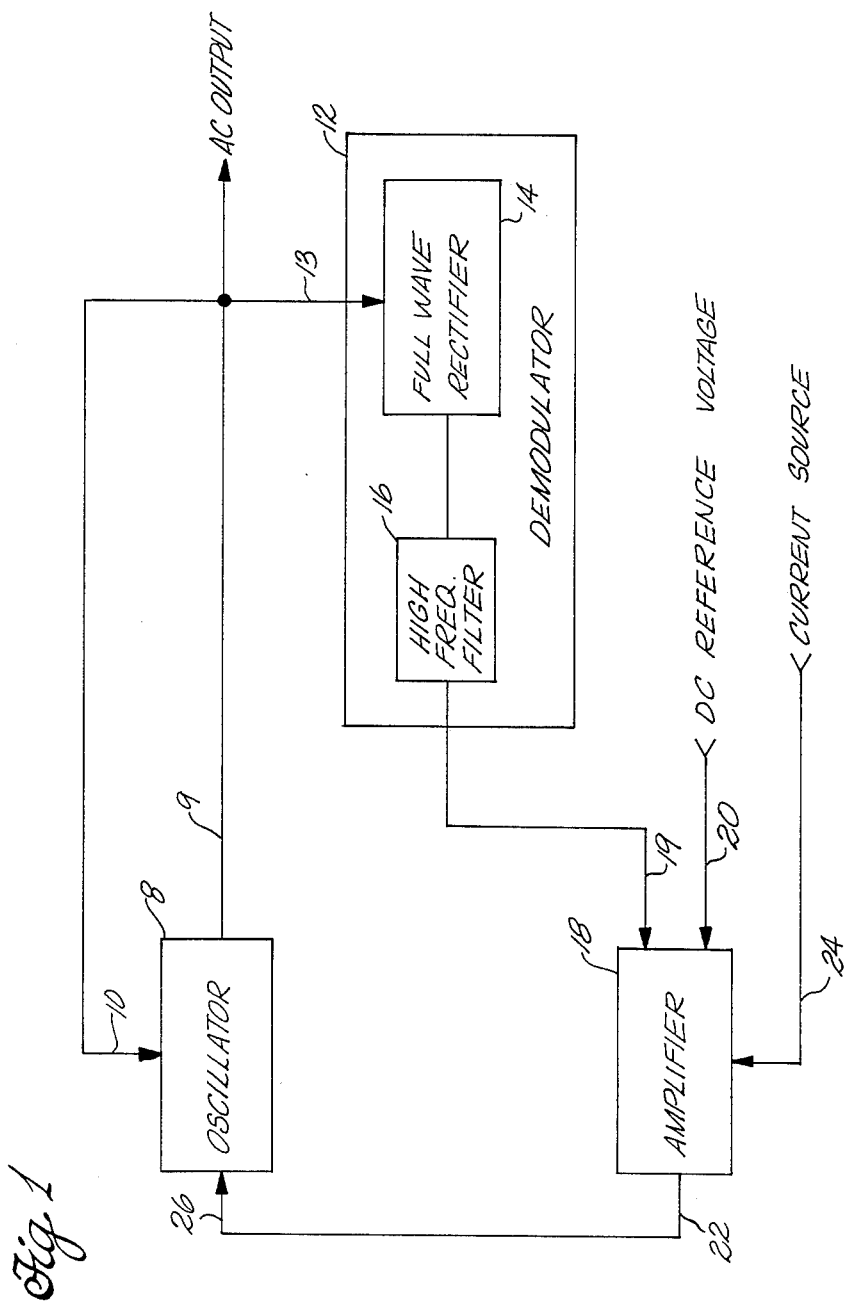
FIG. 1 is a block diagram of the oscillator and control circuit.

A simplified block diagram of the present invention is provided in FIG. 1. The oscillator 8 provides a sinusoidal AC output on lead 9. The AC output or a sinusoidal signal representing the AC output (as will be described subsequently) is provided to a demodulator 12 on input 13. The demodulator 12 is comprised of a fullwave rectifier 14 and a high frequency smoothing filter 16. The rectified and smoothed control signal is fed from the filter 16 to the amplifier 18 on lead 19. The amplifier 18 compares the signal to a DC reference voltage provided to input 20. A control current is provided at the output of the amplifier 22 for control of the oscillator 8 through input 26. A second input 24 to the amplifier is connected to a current source to limit the control current output from the amplifier as discussed in more detail subsequently. A positive feedback loop is provided from the output 9 of the oscillator to a second input 10 to the oscillator 8.

Figure 2:
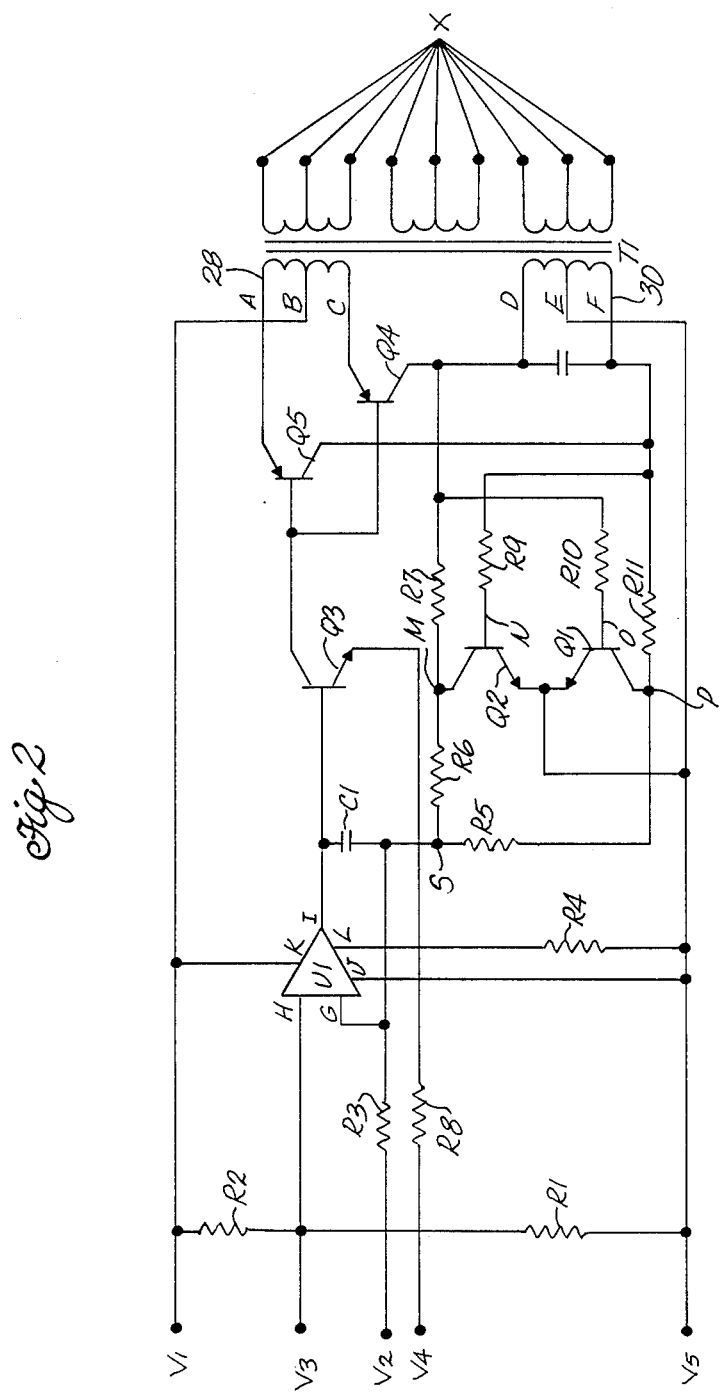
FIG. 2 is a detailed schematic diagram of the oscillator and control circuit according to the present invention; and, FIG. 3 is a graphical representation of the signal shape present at selected points in the circuit.

Referring now to FIG. 2, the present embodiment of the invention has a transformer T1 having a primary winding 28 and a secondary winding 30. A first transistor pair Q4 and Q5 with emitter collector electrodes in a push-pull connection has the emitter of Q5 connected to input terminal A of the primary winding 28 and the emitter of transistor Q4 connected to the input terminal C of primary winding 28. A center tap B on primary winding 28 provides DC excitation power to the oscillator through connection to the positive power supply terminal at connection V1. Positive feedback is provided in the oscillator through the transformer windings by connection in proper phase of the collector electrode of transistor Q4 to the output terminal D of the secondary winding 30 of transformer T1 and connection of the collector electrode of transistor Q5 to output terminal F of the secondary winding 30. A capacitive element C3 is also connected across the secondary winding 30 output terminals D and F. Power return on the oscillator is achieved through the connection of center tap E on the secondary winding 30 to the negative power supply terminal at terminal V5. The frequency of oscillation of the oscillator is determined by the tuned circuit formed by the capacitive element C3 and the secondary winding 30 of the transformer T1.

Amplitude control of the oscillator output signal is achieved by the negative feedback loop containing the demodulator 12 and amplifier 18. In the embodiment shown in FIG. 2 the demodulator 12 of FIG. 1 comprises a second transistor pair Q1 and Q2. The second transistor pair Q1 and Q2 are both connected common emitter to the Center tap of the secondary winding and the negative power supply terminal V5. The base of Q1 is connected through resistor R10 to Terminal D of the secondary winding and the base of Q2 is connected through resistor R9 to Terminal F of the Secondary winding. The collector of Q1 is connected between resistors R5 and R11 to terminal F of the secondary winding and to a common output S. The collector of Q2 is similarly connected between resistors R6 and R7 to terminal D of the secondary winding and to the common output S.

Operation of the demodulator can be best understood with reference to FIG. 3. In FIG. 3 all wave shapes are shown referenced to the negative power supply terminal V5 as ground. The signals at terminals D and F of the secondary winding are sine waves which are 180 degrees out of phase. The voltage applied through resistors R9 and R10 to the bases of Q2 and Q1 respectively alternately drive each transistor into saturation.

When "F" is positive, Q2 is saturated and "M" is essentially connected to "E" (ground). The negative signal from "D" is ineffective. At the same time, the positive "F" signal is divided by R11, R5 and R6 so that the voltage drop across R6 appears at "S". The signal at "O" is negative and the same magnitude as at "D" provided that the zener voltage of the emitter/base junction of Q1 is not exceeded. On the next half cycle, the voltage at "S" is the voltage drop across R5.

Points M and P are therefore alternately connected to ground through the saturated transistor for one half cycle. During the other half cycle the transistor is shut off creating an open circuit. The resulting wave forms are shown in FIG. 3 for points D, F, 0, N, M, and P. The signal appearing at the common output S is therefore rectified and ⅓ the voltage of the signal appearing at either terminal D or F.

The values of resistors R5 through R11 are not critical. Since the resistors may be viewed as a string starting at the base of Q1 and ending at the base of Q2 of R10, R7, R6, R5, R11, and R9, a common size may have advantages in construction and assembly.

The control signal from common output S is provided to the amplifier 18 of FIG. 1. The amplifier includes an operational amplifier U1 and a transistor Q3. The control signal from the demodulator is provided to the operational amplifier U1 at pin G. Capacitor C1 effectively filters any high frequency ripple so that the voltage at pin I becomes a direct current voltage. A reference voltage generated by a voltage divider formed by resistors R1 and R2 is connected to the operational amplifier U1 at pin H.

In the embodiment shown in FIG. 2, the voltage divider formed by resistors R1 and R2 is connected across the power supply input and return V1 and V5. This voltage divider arrangement could be replaced by a zener diode configuration where replacement of resistor R1 with a zener diode would provide a closely controlled supply voltage for reference to pin H of the operational amplifier U1. Operational amplifier U1 compares the reference voltage present on pin H and the control signal present on pin G to provide a voltage controlled output on pin I.

A second stage of the amplifier 18 comprises a transistor Q3. Transistor Q3 is incorporated into the circuit as an emitter follower. A control voltage is provided to the base electrode of transistor Q3 by the voltage controlled output at pin I of the operational amplifier U1. The emitter electrode of Q3 is connected to resistor R8. Current flows through resistor R8 and the emitter/collector circuit of transistor Q3, increasing or decreasing consistent with bias changes on the base electrode.

Resistor R8 acts as a load to convert the base voltage of transistor Q3 to a proportional collector current from a second voltage present on connection V4. The second voltage may be provided by a second voltage divider from the power input and return or other appropriate means.

The collector electrode of transistor Q3 is connected to the base electrodes of both transistor Q4 and transistor Q5, the first transistor pair of the oscillator 8. The collector electrode of transistor Q3 thereby provides a common bias for transistors Q4 and Q5 in the form of a control current, which increases or decreases in response to the voltage controlled output from the operational amplifier U1. This completes the negative feedback path for control of the oscillator 8.

As an alternative to the embodiment shown in FIG. 2, resistor R8 and transistor Q3 may be replaced by a Field Effect Transistor (FET) to provide constant current proportional to gate voltage on the FET.

In the embodiment shown, resistor R4 is connected to pin L of operational amplifier U1 to provide supply current control. Connections V2 and V3 shown in FIG.

2 provide feedback points for linearizing the oscillator output as described in prior art U.S. Pat. No. 3,837,227 to Tavis. Resistor R3 is a balance resistor for the linearizing feedback connection V2. Capacitor C1 in conjunction with resistors R3, R5 and R6 provides filtering for the control signal for input G of the operational amplifier U1. Multiple outputs X for the stabilized oscillator are provided for operation of transducers and the like.

Operation of the oscillator and control circuit is best described by assuming a start with no power applied to the system. When power is applied to the power input and return connections V1 and V5, pin H of operational amplifier U1 will be positive with respect to pin G. Comparison of the signals present on pin G and pin H will result in a control output current from pin I of operational amplifier U1 to the base electrode of transistor Q3. Pin I of operational amplifier U1 will be positive with respect to the emitter electrode of transistor Q3, thereby providing a positive bias. Current flow in transistor Q3, regulated by the reference current source, will result in biasing of transistors Q4 and Q5 in the oscillator 8. Either Q4 or Q5 will conduct a high current to begin oscillation. As oscillation builds in the primary and secondary windings of the transformer T1, the output of the oscillator across the secondary winding 30 is detected by the demodulator and rectified as previously described by alternate operation of transistors Q1 and Q2. Saturated transistors Q2 and Q1 have very low resistance when conducting. Further, they conduct in both directions. Therefore no instantaneous rectified noise signal can seriously modify the average detected signal by transistors Q1 and Q2. Noise rejection of the invention as shown in the embodiment of FIG. 2 is significant. The noise is reduced to as little as one part in one million. Use of the present embodiment of the invention with variable reluctance pressure transducers allows measurement of pressure changes which are in the order of $1 \times 10^{-6}$ of full scale due to the extremely high signal to noise ratio.

The rectified sine wave signal across resistors R5 and R6 is smoothed by the drain from capacitor C1 to provide the control signal to the operational amplifier U1. As the output of the oscillator 8 builds, the control signal derived through transistors Q1 and Q2 drives pin G of the operational amplifier U1 equal to the voltage at pin H. Close regulation now takes place by comparison of the reference voltage present at terminal V3 input to the operational amplifier on pin H and the control signal input to the operational amplifier at pin G. Positive and negative changes in the output of the operational amplifier U1 increase or reduce the bias on transistor Q3 which in turn results in corresponding changes in the collector current of transistor pair Q4 and Q5 of the oscillator, thereby controlling the oscillator output amplitude. The AC voltage appearing across the terminals D and F of the secondary winding is averaged and divided by three to equal the input DC reference voltage across R1 (provided that R5, R6, R7, R9, R10 and R11 are of equal resistance). Therefore the RMS AC output is given by the equation:

$$Vrms = 2.22*(2 + R11/R6)*Vref.$$

The circuit elements used in the preferred embodiment shown in FIG. 2 are as follows:

TABLE I

| U1 | OP22 | | Q1 | 2N 2432A |
|---|---|---|---|---|
| R1 | 25.5 | Kohms | Q2 | 2N 2432A |
| R2 | 249 | Kohms | Q3 | 2N 2222A |
| R3 | 100 | Kohms | Q4 | 2N 2907A |
| R4 | 2.7 | Mohms | Q5 | 2N 2907A |
| R5 | 100 | Kohms | C1 | 1.0 mfd |
| R6 | 100 | Kohms | C3 | .0047 mfd |
| R7 | 100 | Kohms | | |
| R8 | 22.1 | Kohms | T1 | P/N 19161 |
| R9 | 100 | Kohms | V1-V5 | 5 volts DC |
| R10 | 100 | Kohms | | |
| R11 | 100 | Kohms | | |

Those skilled in the art will recognize that replacement of PNP transistors with NPN transistors and vice versa and reversing of positive and negative power input and return at terminals V1 and V5 will result in identical circuit operation.

The embodiment of the invention shown uses very little power (Approximately 500 uWatts {0.1 ma at 5 volts}) yet maintains good wave shape and regulation when loaded. Typical idling current in the preferred embodiment as described is less than 0.1 milliampere with 30 microampere idling current quite feasible.

Further, the output low frequency noise at frequencies of 0.1 Hz to 5 Hz is very low. When used to drive a variable reluctance pressure transducer, the combined noise from the oscillator, the transducer, and the rest of the circuit is approximately 13 parts per million of the full scale range of the transducer. This compares with the circuit of U.S. Pat. No. 3,763,444 which has a noise level of about 1 part in 5000 or 1000 parts per million. Thus the present invention is at least 75 times as quiet as the '444 circuit. This provides great advantage in many pressure measuring applications.

Having now described the invention in detail in accordance with the requirements of the patent statutes, those skilled in the art will have no difficulty in making changes and modifications in the individual parts or their relative assembly in order to meet specific requirements or conditions. Such changes and modifications may be made without departing from the scope and spirit of the invention as set forth in the following claims.

What is claimed is:

1. An improved low power consumption amplitude stabilized oscillator circuit comprising:

a sine wave oscillator having a first transistor pair with emitter and collector electrodes connected in push-pull arrangement, with the emitter electrodes connected across a primary winding of a transformer and with the collector electrodes connected across a secondary winding of the transformer, and further having a capacitive element connected across the secondary winding, the oscillator producing a sinusoidal output signal;

a synchronous full wave phase sensitive demodulator means including a second switching transistor pair with emitter and collector electrodes connected in push-pull arrangement, connected to the oscillator for receiving sinusoidal signals representative of the amplitude of the output signal and producing a full wave D.C. rectified signal;

a high frequency filter means connected to the demodulator means for smoothing the rectified signal to provide a control voltage;

a reference signal source providing constant DC reference voltage; and an amplifier means connected to the filter means for comparing the control voltage to the DC reference voltage and producing a control signal output to the oscillator.

2. A device as defined in claim 1 in which the amplifier means comprises an operational amplifier having a first input connected to the reference signal source, a second input connected to the filter means and a biasing signal output, and a single transistor having the base electrode connected to receive the biasing signal output, the emitter electrode connected to a current source and the collector electrode connected to the oscillator as the control signal output for control of the oscillator.

3. A device as defined in claim 1 in which the second pair of transistors in the full wave demodulator means are each configured in a common emitter circuit with collector electrodes connected to receive sinusoidal signals representative of the amplitude of the oscillator output signal, and base electrodes connected to receive the sinusoidal signals with reverse polarity and sufficient amplitude to alternately drive each transistor of the second transistor pair into saturation, the collector electrodes of the second transistor pair further being commonly connected to supply a rectified control signal.

4. An improved amplitude control circuit for a stabilized sinusoidal oscillator having a control current input and output terminals for a sinusoidal signal, the improvement comprising:

a signal demodulator having a full wave rectifier means including push-pull transistor elements to receive and rectify the full sinusoidal signal, the signal demodulator further having a filter means connected to the rectifier means, and an output for a control signal; and an amplifier having as a first stage a comparator with a first input connected to a reference voltage signal, a second input connected to the output of the filter means, and a control bias output, the amplifier having as a second stage a transistor with the base electrode connected to the control bias output, the emitter electrode connected to a current source, and the collector electrode connected to the control current input of the oscillator.

5. An improved amplitude control circuit for a stabilized sinusoidal oscillator having a transformer with primary winding input terminals, a primary winding center tap terminal for positive power input, secondary winding output terminals, a secondary winding center tap terminal for power return, a first transistor pair with emitter collector electrodes in push-pull connection, and with the emitter electrodes connected to the primary winding input terminals and the collector electrodes connected to the secondary winding output terminals, the first transistor pair further having base electrodes which are connected together to receive a control current and a capacitive element connected across the secondary winding output terminals, the improvement comprising:

a synchronous full wave phase sensitive demodulator having a second transistor pair with emitter electrodes connected in common emitter configuration, with the collector electrodes connected to the transformer secondary winding output terminals, and with the base electrodes connected to the transformer secondary winding output terminals with opposite polarity;

a high frequency filter means connected to the collector electrodes of the second transistor pair for smoothing a control signal from the demodulator; and an amplifier having a first stage comprising an operational amplifier with a first input connected to a reference voltage signal, a second input connected to the filter means for receiving the control signal, and a voltage controlled output to a second stage comprising a transistor having a base electrode connected to the voltage controlled output, an emitter electrode connected to a current source and a collector electrode connected to the base electrodes of the first transistor pair in the oscillator to provide bias for controlling current to the oscillator.

* * * * *

UNITED STATES PATENT AND TRADEMARK OFFICE
CERTIFICATE OF CORRECTION

PATENT NO. : 4,947,139

DATED : August 7, 1990

INVENTOR(S) : John R. Tavis

It is certified that error appears in the above-identified patent and that said Letters Patent is hereby corrected as shown below:

```
Column 1, line 53, change "The-" to -- The --.
Column 2, line 68, change "fullwave" to -- full-wave --.
Column 3, line 68, change "0" to -- O --.
Column 4, line 8, change "0" to -- O --.
Column 5, line 41, change "Cl" to -- C1 --.
```

Signed and Sealed this

Thirty-first Day of December, 1991

Attest:

HARRY F. MANBECK, JR.

*Attesting Officer*   *Commissioner of Patents and Trademarks*